United States Patent
Shim (10) Patent No.: US 10,741,336 B2
(45) Date of Patent: Aug. 11, 2020

(54) SUPERCONDENSER PROVIDED WITH SERIAL AND PARALLEL CONNECTOR

(71) Applicant: KYUNG IL GREEN TECH CO., LTD., Seosan-si (KR)

(72) Inventor: Eon Kyu Shim, Yongin-si (KR)

(73) Assignee: KYUNG IL GREEN TECH CO., LTD., Seosan-si (KR)

( * ) Notice: Subject to any disclaimer, the term of this patent is extended or adjusted under 35 U.S.C. 154(b) by 0 days.

(21) Appl. No.: 16/092,552

(22) PCT Filed: Jun. 20, 2017

(86) PCT No.: PCT/KR2017/006470
§ 371 (c)(1),
(2) Date: Oct. 10, 2018

(87) PCT Pub. No.: WO2018/056553
PCT Pub. Date: Mar. 29, 2018

(65) Prior Publication Data
US 2019/0206631 A1     Jul. 4, 2019

(30) Foreign Application Priority Data
Sep. 26, 2016 (KR) .......... 10-2016-0123231

(51) Int. Cl.
*H01G 11/08* (2013.01)
*H03H 17/02* (2006.01)
(Continued)

(52) U.S. Cl.
CPC .......... *H01G 11/08* (2013.01); *H01G 11/10* (2013.01); *H02J 7/0014* (2013.01);
(Continued)

(58) Field of Classification Search
CPC ........ H01G 4/306; H01G 4/008; H01G 4/015; H01G 4/30; H01G 11/08; H01G 11/10;
(Continued)

(56) References Cited

U.S. PATENT DOCUMENTS

2013/0034751 A1* 2/2013 Geng ................ H01M 10/4207
429/7
2014/0316679 A1* 10/2014 Nishida .................. F02D 41/20
701/104
2014/0320086 A1 10/2014 Wallis

FOREIGN PATENT DOCUMENTS

CN    201174324    12/2008
CN    101611463    12/2009
(Continued)

OTHER PUBLICATIONS

International Search Report—PCT/KR2017/006470 dated Aug. 30, 2017.

*Primary Examiner* — Michael P McFadden
(74) *Attorney, Agent, or Firm* — Cantor Colburn LLP (57) ABSTRACT

Provided is a supercondenser which is an ultra-high capacity supercondenser for storing energy in the fields of commercial electricity and new and renewable energy, which is provided with a specific connector for connecting a plurality of unit condensers in series, parallel, or series-parallel and is thereby electrically stable, requires few members for connection, and has improved stability and durability. The supercondenser which includes a plurality of unit condensers, and a connector including a parallel connection means for connecting the unit condensers in parallel, and a serial connection means for connecting same in series.

9 Claims, 10 Drawing Sheets

(51) Int. Cl.
*H02J 7/00* (2006.01)
*H01G 11/10* (2013.01)
*H02J 7/34* (2006.01)
*H03H 11/04* (2006.01)

(52) U.S. Cl.
CPC .......... *H03H 17/0219* (2013.01); *H02J 7/345* (2013.01); *H03H 11/04* (2013.01); *Y02E 60/13* (2013.01)

(58) Field of Classification Search
CPC .... H02J 7/0014; H02J 7/345; H03H 17/0219; H03H 11/04; Y02E 60/13
See application file for complete search history.

(56) References Cited

FOREIGN PATENT DOCUMENTS

| | | |
|---|---|---|
| CN | 202282256 | 6/2012 |
| CN | 103038916 | 4/2013 |
| JP | 2009135335 | 6/2009 |
| JP | 2013037861 | 2/2013 |
| JP | 2013532890 | 8/2013 |
| JP | 2013218932 | 10/2013 |
| JP | 2013229130 | 11/2013 |
| KR | 20130093697 | 8/2013 |

\* cited by examiner

SUPERCONDENSER PROVIDED WITH SERIAL AND PARALLEL CONNECTOR

TECHNICAL FIELD

The present invention relates to a supercondenser which is an ultra-high capacity supercondenser for storing energy in the fields of commercial electricity and new-and-renewable energy, more particularly, the present invention relates to a supercondenser which is provided with a specific connector for connecting a plurality of unit condensers in series, parallel, or series-parallel, and is thereby electrically stable, requires few members for connection, and has improved stability and durability.

BACKGROUND ART

A supercondenser is an ultra-high capacity energy storage device having higher capacity than a general condenser or an electrolytic condenser. An ultra-high capacity supercondenser is a power source that collects much energy and discharges high energy for several tens of seconds or a few minutes, and thus the supercondenser is a useful new-and-renewable energy storage device to fill a performance characteristic area that conventional condenser and rechargeable batteries cannot accommodate. Especially, the supercondenser shows excellent charging performance for storing new and renewable energy having output patterns that are difficult to predict.

The supercondenser is an energy storage device having advantages such as semi-permanent long lifetime, hundreds of thousands of charging and discharging cycles, operating temperature conditions of −40 to 90° C., 95 to 99% charging and discharging efficiency, and eco-friendly materials, thus the supercondenser is used as main power and auxiliary power in place of a battery. In order for the supercondenser to be used as an energy storage device, each supercondenser should be assembled as unit condensers, and the assembled unit condensers should be modularized by connecting them in series-parallel using a connector.

However, in a conventional connecting structure, a plurality of supercondensers is connected in series using a printed circuit board (PCB) for stability of charging and discharging voltage, and is connected by soldering a terminal between unit condensers. Likewise, the solder connections using PCB have some structural defects instead of safety for voltage stabilization, and cause some problems such as PCB manufacturing costs, short circuiting of connecting portions due to cold soldering, complexity of a production line, and durability degradation due to a strength member of a PCB material, outbreak of an occupational disease of soldering worker, and atmosphere environmental pollution.

Recently, to solve the above problems, although a busbar, a nut, and a washer are used as a connecting structure, when connection between the supercondenser and the busbar is unstable or fastening by the nut and the washer is not accurate in realizing a module, contact resistance and load increase, and high temperature heat is generated.

In addition, a structure wherein the busbar, the nut, and the washer are connected to each supercondenser is vulnerable to breakage due to external influence and vibration, and in a case of the busbar with many coupling and fastening assembling processes, a manufacturing process of the super capacitor module is complicated and is difficult to be standardized.

As a related art of the supercondenser, in Korean Patent Application Publication No. 10-2013-0093697 (published on Aug. 23, 2013) (hereinbelow, the related art), the related art provides a high-capacity super capacitor module in which size of a module may be adjusted according to amount and size of a super capacitor cell and full capacity of the super capacitor may be extended to desired size.

However, the related art provides a parallel connection of the supercondenser, but does not provide a solution for a serial connection.

DISCLOSURE

Technical Problem

The present invention has been made keeping in mind the above problems, and an object of the present invention is to provide a connector for connecting a plurality of unit condensers in series, parallel, and series-parallel to provide a supercondenser having desired capacity.

Another object of the present invention is to provide electrical stability in an assembly of the plurality of unit condensers through a parallel connection means and a serial connection means having unique structures.

Additional object of the present invention is to realize an integrated supercondenser and to minimize required connection members through a parallel connection means and a serial connection means having unique structures so as to improve stability and durability.

Technical Solution

In order to accomplish the above object, the present invention provides a supercondenser including:

a plurality of unit condensers, and a connector having a parallel connection means for connecting the unit condensers in parallel and a serial connection means for connecting the unit condensers in series.

The parallel connection means may have a plate, and terminal coupling parts provided on the plate and coupled to terminals of the unit condensers.

In addition, the serial connection means may have a plate, connection pieces connected to ends of the plate by protruding upward and downward, a connection hole provided on each of the connection pieces, and a coupling member inserted through the connection hole.

Preferably, the supercondenser further includes a control module including a charging control unit for controlling charging of the unit condensers by an external power source, a power output unit for outputting electricity stored in the unit condensers, and a central control unit for controlling the charging control unit and the power output unit by using control signals.

Advantageous Effects

As described above, the present invention can provide a connector for connecting a plurality of unit condensers in series, parallel, or series-parallel to provide a supercondenser having the desired capacity, wherein connection structures of the unit condensers may be separated into an even number and an odd number.

Also, through a parallel connection means and a serial connection means having unique structures, an assembly of the plurality of unit condensers has electrical stability, resistance to strong external vibration and influence, and provides reliable performance.

In addition, through the parallel connection means and the serial connection means having unique structures, it is possible to save time and cost in all of work processes as well as assembling work of the supercondenser, simplify assembling work, realize standardization, and to improve convenience and efficiency of the work processes.

Moreover, a voltage balancing module is provided to evenly distribute voltage between each unit condenser or each condenser unit (an assembly of unit condensers), and voltage balancing module prevents damage or breakage due to voltage difference, so that it is possible to ensure performance of the supercondenser and extend lifetime thereof.

Since the new-and-renewable energy is quickly charged and discharged slowly through the supper condenser according to the present invention, a power storage device that functions as a battery may be realized.

MODE FOR INVENTION

The present invention will now be described in detail based on aspects (or embodiments). The present invention may, however, be embodied in many different forms and should not be construed as being limited to only the embodiments set forth herein, but should be construed as covering modifications, equivalents or alternatives falling within ideas and technical scopes of the present invention.

In the figures, like reference numerals, particularly, reference numerals having the same last two digits or the same last two digits and letters refer to like elements having like functions throughout, and unless the context clearly indicates otherwise, elements referred to by reference numerals of the drawings should be understood based on this standard.

Also, for convenience of understanding of the elements, in the figures, sizes or thicknesses may be exaggerated to be large (or thick), may be expressed to be small (or thin), or may be simplified for clarity of illustration, but due to this, the protective scope of the present invention should not be interpreted narrowly.

The terminology used herein is for the purpose of describing particular aspects (or embodiments) only and is not intended to be limiting of the present invention. As used herein, the singular forms are intended to include the plural forms as well unless the context clearly indicates otherwise.

Unless otherwise defined, all terms including technical and scientific terms used herein have the same meaning as commonly understood by one of ordinary skill in the art to which the present invention belongs. It will be further understood that terms used herein should be interpreted as having a meaning that is consistent with their meaning in the context of this specification and the relevant art and will not be interpreted in an idealized or overly formal sense unless expressly so defined herein.

Terms such as "a first ~" and "a second ~" are used only for the purpose for distinguishing a constitutive element from other constitutive element, but constitutive element should not be limited to a manufacturing order, and the terms described in the detailed description of the invention may not be consistent with those described in the claims.

The present invention relates to a supercondenser, which has a specific connector for connecting a plurality of unit condensers in series, parallel, or series-parallel, thereby the supercondenser is electrically stable, requires minimum members for connecting, and improves stability and durability.

Hereinbelow, referring to the accompanying drawings, the supercondenser (hereinbelow, the supercondenser S) according to the present invention will be described in detail. The supercondenser has a connector capable of serial and parallel connection.

Figure 1:
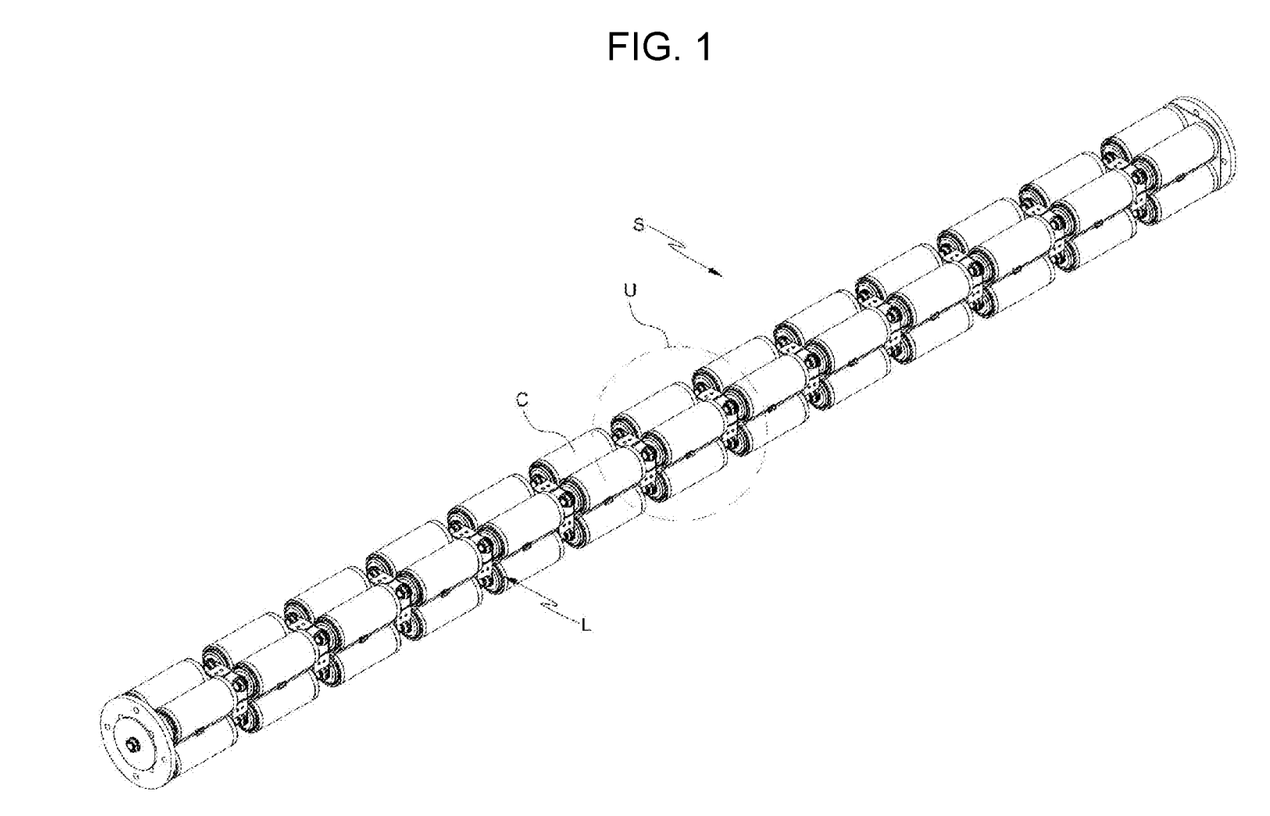
FIG. 1 is a perspective view of the present invention.
Figure 2:
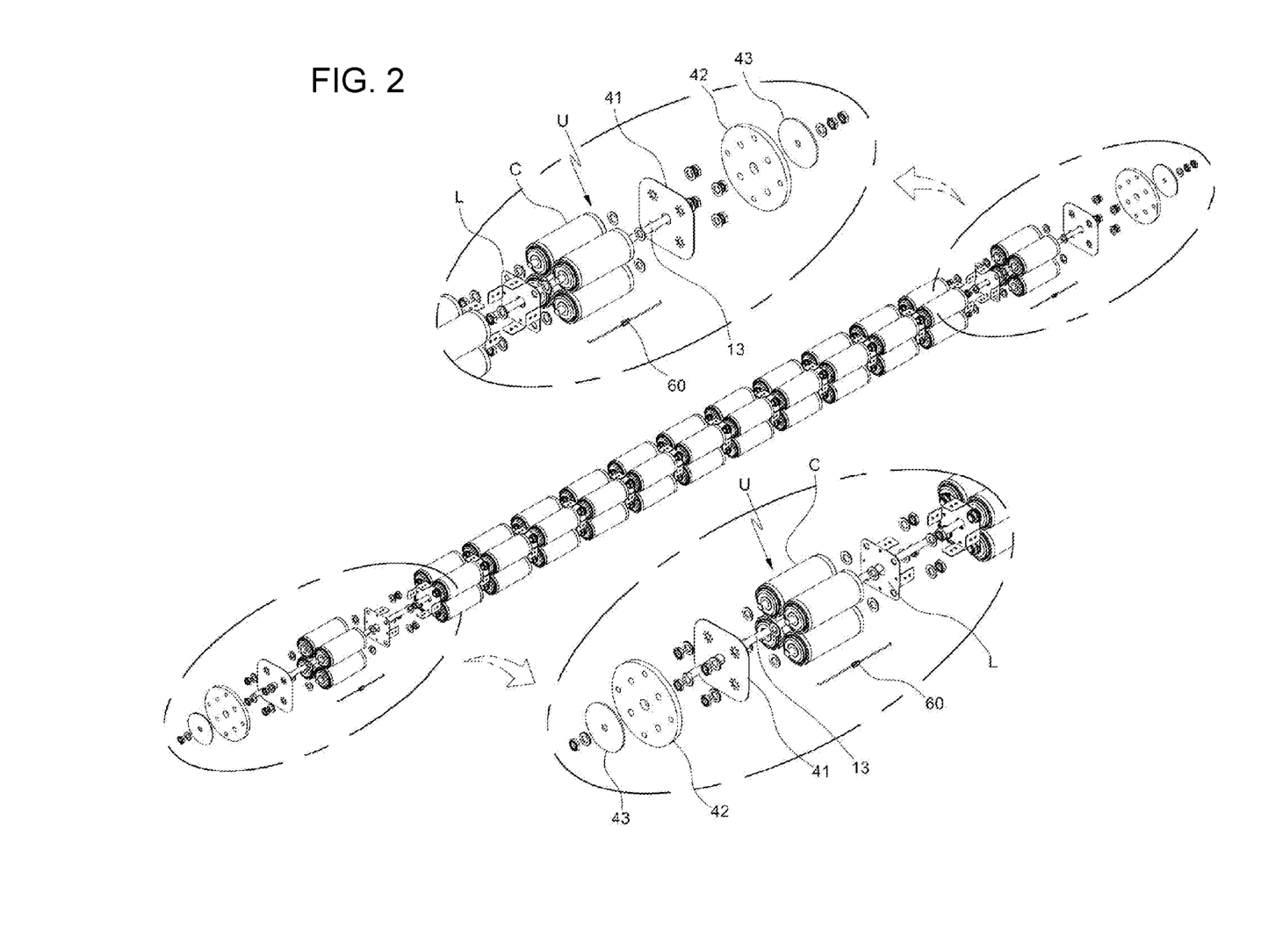
FIG. 2 is an exploded perspective view of the present invention.

FIG. 1 is a perspective view of the present invention, and FIG. 2 is an exploded perspective view of the present invention. The supercondenser S will be described in detail with reference to FIGS. 1 and 2, First, the supercondenser S broadly includes multiple unit condensers C and a connector L for connecting the unit condensers C.

As a central characteristic of the present invention, the connector L includes a parallel connection means 1 for connecting the unit condensers C in parallel and a serial connection means 2 for connecting the unit condensers C in series.

The present invention provides the connector L with the above configuration, thereby the supercondenser S may obtains desired charging capacity by connecting the unit condensers C variously in series, parallel, or series-parallel.

FIGS. 3 to 8 are views showing various embodiments of the present invention, and showing examples such that the unit condensers C applying the connector L are connected to each other in series-parallel.

As shown in FIGS. 3 to 8, the parallel connection means 1 of the connector L which is central characteristic of the supercondenser S includes a plate 10, and terminal coupling parts 11 provided on the plate 10 and respectively coupled with terminals of the unit condensers C.

Figure 3:
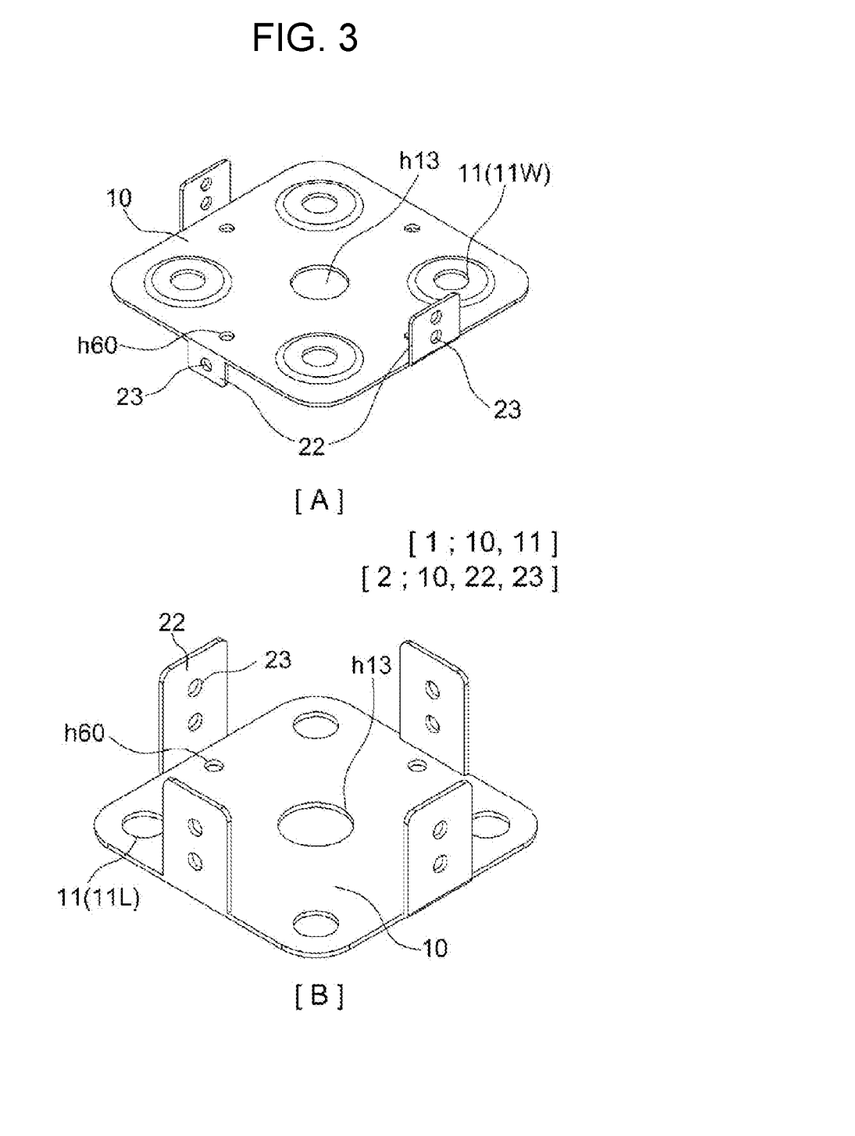
FIGS. 3 to 8 are views showing various embodiments related to a connector of the present invention (a first embodiment to a sixth embodiment).

Referring to FIG. 3 (a first embodiment), the parallel connection means 1 will be described in more detail, the plate 10 provides a base on which the unit condensers C are connected together, the terminal coupling parts 11 provided on the plate 10 are coupled with terminals of the unit condenser C, the number of terminal coupling parts 11 corresponds to the number of the unit condensers C that may be connected in parallel.

FIG. 3 shows an example of four unit condensers C for a parallel connection, and four terminal coupling parts 11 are provided on the plate 10.

As shown in FIGS. 3A and 3B, the terminal coupling part 11 may be provided separately in two types, a welded terminal coupling part 11W and a fastening terminal coupling part 11L.

The welded terminal coupling part 11W includes a contacting portion to which the terminal of the unit condenser C is contacted and a welding expected portion provided on the contacting portion, so that the contacting portion of the welded terminal coupling part 11W and the terminal of the unit condenser may be coupled by welding the welding expected portion.

For embodiments of the welded terminal coupling part 11W, for example, razor welding, electric arc welding, oxygen welding, and argon welding, etc. may be used as the welding method.

The fastening terminal coupling part 11L includes a through portion through which the terminal of the unit condenser c is passed, and a nut member that fastens the terminal passed through the through portion, so that the terminal of the unit condenser may be coupled to the plate by fastening through the nut member and the through portion.

In addition, the nut member should be sufficiently larger than the through portion, and the terminal of the unit condenser should have nut thread for coupling with the nut member. Although the nut member is omitted in FIG. 3, it is not difficult to guess existence of the nut member through the through portion.

For embodiments of the fastening terminal coupling part 11L, for example, a steel screw, a nut and a washer, a rivet and a bolt, etc. may be used.

Through the parallel connection means 1 having the above configuration and characteristic, the supercondenser having desired charging capacity may be obtained by connecting the unit condensers C in parallel. Meanwhile, a coupling method of the terminal coupling part 11 may escape from a conventional solder structure, whereby it is possible to solve the problems of the solder structure such as a short circuit of connecting portions due to cold soldering, complexity of a production line and a strength member by introducing a PCB for soldering, outbreak of occupational diseases of a soldering worker, and environmental pollution.

In addition, the parallel connection means 1 escape from a busbar structure, whereby it is possible to solve the problems, which are disadvantages of the busbar structure, such as resistance of fastening portion, heat generation due to load increase, weakness of the fastening portion from breakage due to external shock and vibration, complexity increase of assembly process, and difficulty of standardizing.

Therefore, through the parallel connection means 1, the present invention realizes electrical stability, requirement of few members for connection, and improved stability and durability.

As shown in FIGS. 3 to 8, the serial connection means 2 of the connector L which is central characteristic of the supercondenser S includes a plate 10, connection pieces 22 connected to ends of the plate 10 so as to protrude upward and downward, a connection hole 23 provided on the connection pieces 22, and a coupling member (not shown) inserted through the connection hole 23.

The plate 10 of the serial connection means 2 has a same configuration as the plate 10 of the parallel connection means 1, and provides a base on which the unit condensers C are connected together.

The connection pieces 22 protrude upward and downward from the ends of the plate 10, a protruding direction is preferably opposed to a direction of the unit condensers C to be coupled relative to the plate 10 (referring to FIGS. 4 to 8).

For example, when the unit condenser C is coupled on an upper portion of the plate 10, a connection piece 22 protrudes downward from the end of the plate 10, and when the unit condenser C is coupled under a lower portion of the plate 10, a connection piece 22 protrudes upward from the end of the plate 10.

The connection piece 22 may be provided such that the connection piece 22 is welded on the plate 10. Alternatively, when molding the plate 10, the connection piece 22 is also molded to protrude from the end of the plate 10 and then bent.

The connection hole 23 is provided on the connection piece 22, for the coupling member (not shown) to be inserted.

An embodiment of the serial connection means 2 having the above configuration will be described: two plates 10 of two unit condensers C to which are to be connected in series are stacked up so that the each of connection pieces 22 of each of plates is overlapped with each other. After two connection holes 23 of the two connection pieces 22 are located in same position, and the coupling member (not shown) is then inserted to pass through the two connection holes 23 and the two plates 10 that belong to the coupling member (not shown), the serial connection of the unit condenser C by the serial connection means 2 is finished.

As the parallel connection means 1 previously described above, the coupling member (not shown) of the serial connection means 2 is also provided separately in two types: a welded coupling member and a fastening coupling member.

The welded coupling member may be filler material to be melted and filled in the connection hole 23, and the fastening coupling member may have a bolt, a screw, and a rivet inserted in the connection hole 23, and the above-mentioned usage example can be applied here (a welding method and a fastening method).

Through having the serial connection means 2 having the above configuration and characteristic, the present invention can break away from the solder structure and the busbar structure, and realizes electrical stability, a requirement few members for connection, and improved stability and durability.

Hereinbelow, embodiments (second to sixth embodiments) of the connector L as shown in FIGS. 4 to 8 will be described.

(Hereinbelow, for convenience of explanation, the parallel connection means 1 introduced the welded terminal coupling part 11W is named a welded parallel connection means 1W, and the parallel connection means 1 introduced the fastening terminal coupling part 11L is named a fastening parallel connection means 1L. Likewise, the serial connection means 2 introduced the welded coupling member is named a welded serial connection means 2W, and the serial connection means 2 introduced the fastening coupling member is named a fastening serial connection means 2L.

In addition, an assembly of the unit condensers C connected by the parallel connection means 1 is named a condenser unit U.)

Figure 4:
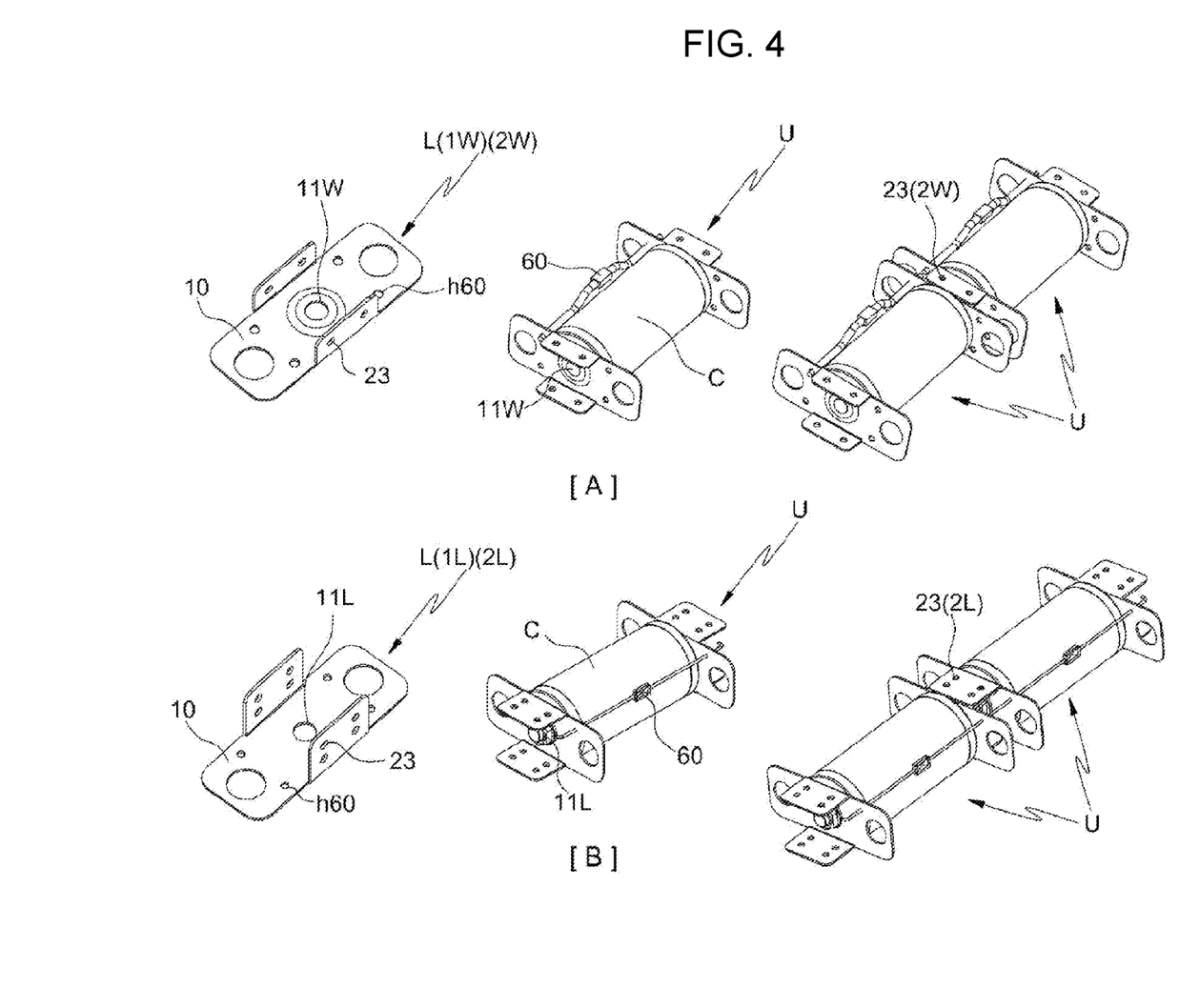

First, FIG. 4 shows a second embodiment of the present invention, in which one unit condenser C constitutes one condenser unit U and two condenser units U are connected in series. FIG. 4 shows that the parallel connection means 1 does not necessarily connect multiple unit condensers C in parallel, and the one unit condenser C is provided for constituting the one condenser unit U.

Figure 5:
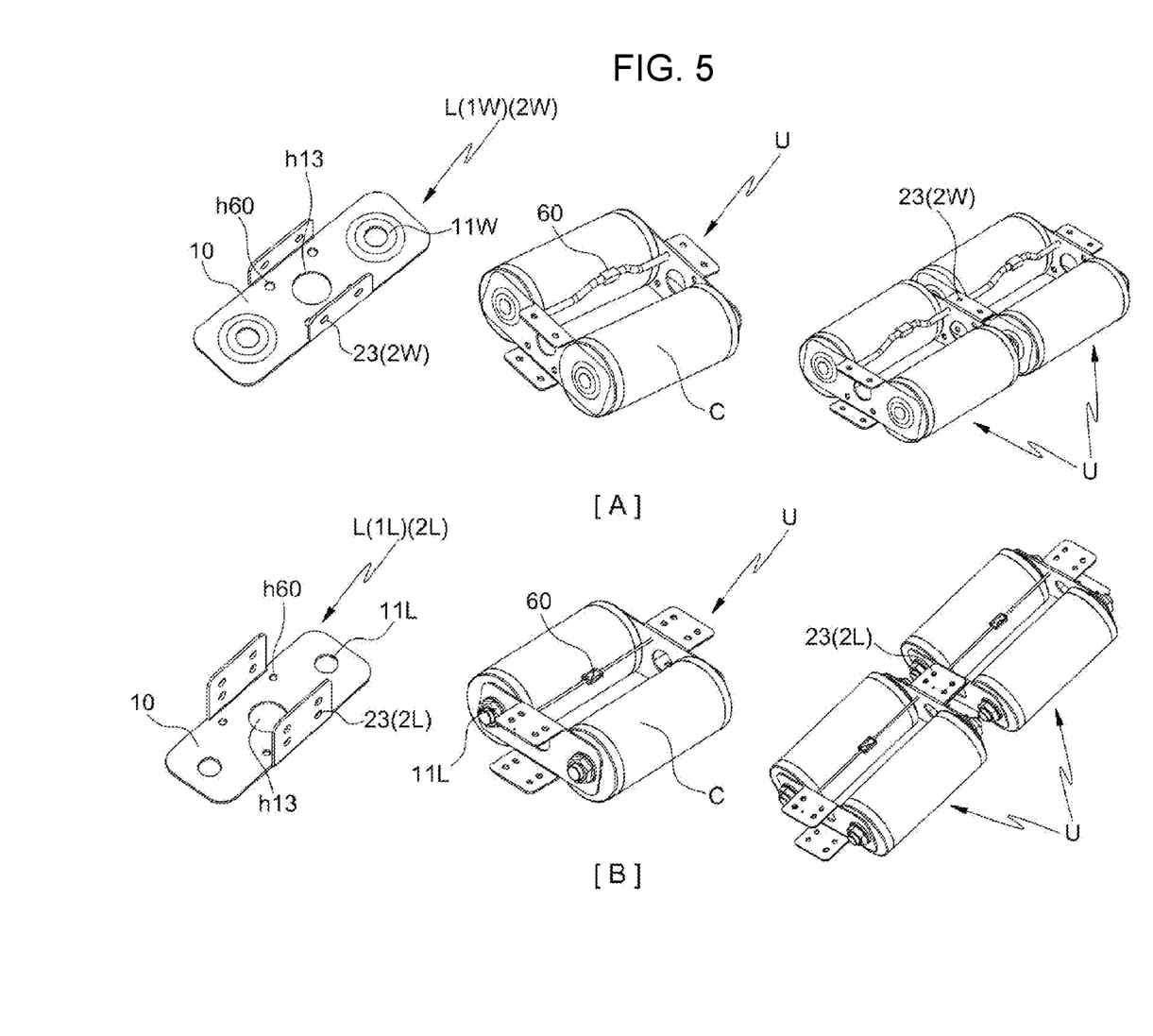

Second, FIG. 5 shows a third embodiment of the present invention, in which two unit condensers C are connected in parallel to constitute one condenser unit U, and two condenser units U are connected in series to constitute the supercondenser.

FIG. 3A shows an embodiment of the welded parallel connection means 1W, in which two contacting portions having two welded terminal coupling parts 11W as the welding expected portion are provided on the plate 10, and with coupling the terminal of the unit condenser C to each of two contacting portions, thus the two unit condensers C are connected in parallel to constitute the one condenser unit U.

Referring to FIG. 3A, there is shown the embodiment of the welded serial connection means 2W, in which each of connection pieces 22 of the two condenser units U is overlapped and each of connection holes 23 is also overlapped, and molten filler material is inserted into all of two connection holes 23 to connect the two condenser units U in series.

FIG. 3B shows an embodiment of the fastening parallel connection means 1L and the serial fastening connection means 2L, the embodiment shows that two fastening terminal coupling parts 11L, i.e. two through portions are provided on the plate 10, and each of terminals of the unit condensers C passes through the through portion to be coupled to the nut member.

This drawing also shows that two condenser units U connected respectively by the fastening terminal coupling part 11L are connected in series by the fastening coupling member. FIG. 3B shows only the connection holes 23 overlapped with each other, the fastening coupling member (bolts, screws, and rivets, etc.) is not shown, but it is not difficult to guess existence of the fastening coupling member through the connection hole 23.

Figure 6:
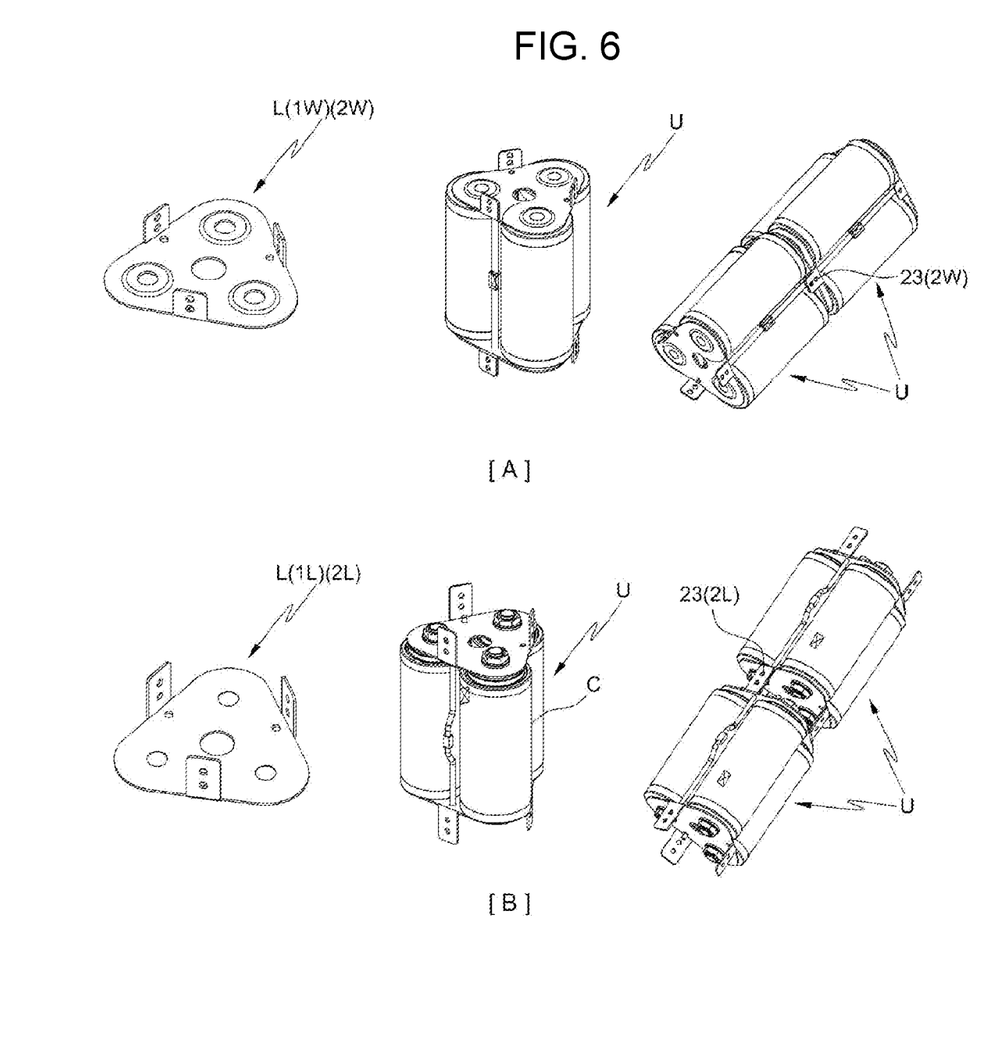
Figure 7:
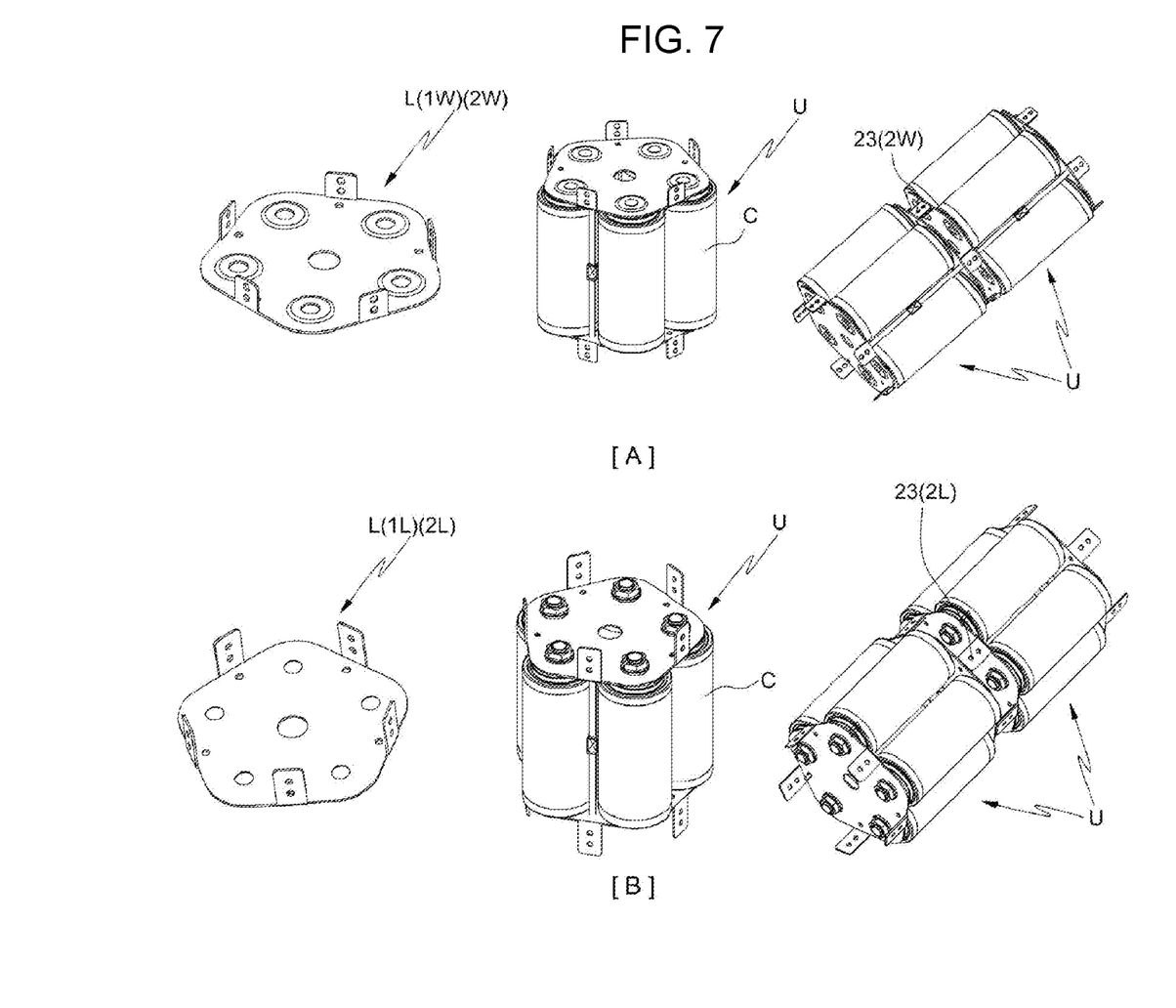
Figure 8:
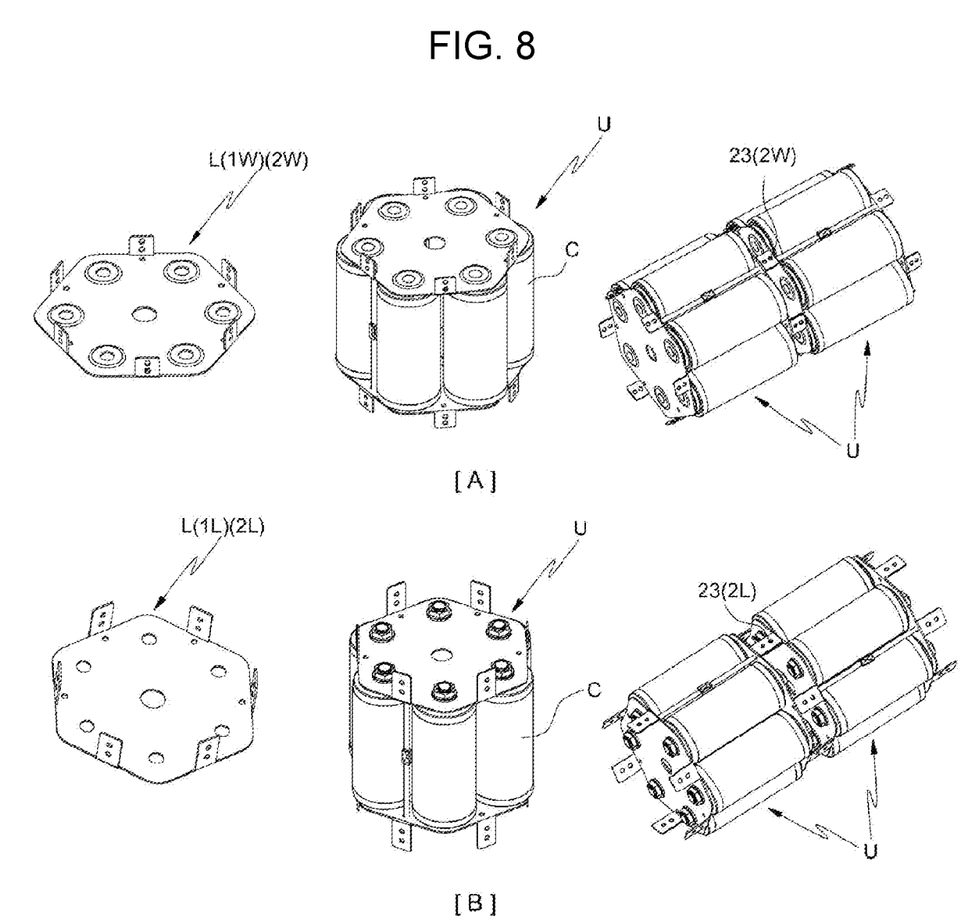

FIGS. 6 to 8 show fourth to sixth embodiments relates to the connector L of the present invention, and only a brief description is provided for FIGS. 6 to 8 because it has almost same structure as FIG. 5 with only different number of unit condensers C.

FIG. 6 shows a fourth embodiment of the present invention, in which three unit condensers C are connected to constitute one condenser unit U, and three condenser units U are connected in series to constitute one supercondenser.

FIG. 7 (a fifth embodiment) shows an embodiment in which five unit condensers C are connected in parallel to constitute one condenser unit U, and FIG. 8 (a sixth embodiment) shows an embodiment in which six unit condensers C are connected in parallel to constitute one condenser unit U.

Referring to embodiments of FIGS. 3 to 8, a number of the terminal coupling parts 11 of the parallel connection means 1 is provided to match a number of the unit condenser C to be connected, for structural stability, and a number of the connection pieces 22 of the serial connection means 2 is preferably provided to match a number of the unit condensers C connected in parallel.

Hereinbelow, subordinate characteristics of the present invention will be described with reference to the accompanying drawings.

As shown in FIGS. 1 to 8, the supercondenser S further includes a voltage balancing module 60 that evenly controls voltage difference between the unit condensers C and voltage difference between the condenser units U.

The voltage balancing module 60 is preferably shaped as a balancing bar inserted in a connection hole h60 provided on the plate 10, the balancing bar is preferably provided between plates 10 coupled to upper and lower ends of the unit condenser C (alternately, the condenser unit U) and preferably provided between the unit condensers C connected to each other in parallel.

In addition, the voltage balancing module 60 may have its own central processing unit (CPU, MCU, MICOM, etc.) so as to perform a control operation.

As shown in FIGS. 1 and 2, the supercondenser S may further include a fixing shaft 13 that supports the assembly of the unit condensers C or the assembly of the condenser units U. Preferably, one fixing shaft 13 passes through all the condenser units U to connect to each other, and may improve structural stability of the condenser unit U.

As shown in FIGS. 3 to 8, the plate 10 has a shaft hole h13 in the center thereof, through which the fixing shaft 13 is inserted, and supports the parallel connection between the unit condensers C and a serial connection between the condenser units U, through this. The fixing shaft 13 provides overall structural stability and improved durability of the supercondenser S.

Preferably, insulation coating material surrounds an outer surface of the fixing shaft 13 for preventing a short.

Additionally, an eye-nut (not shown) may be coupled to both ends of the fixing shaft 13, the eye-nut 3 is convenient to operate of installation, fixing, and mounting the supercondenser S.

In addition, the supercondenser S (assembly of the condenser units U) is surrounded by an insulation shrink tube to have a protective effect against an external influence and an insulation effect, and buffer material such as urethane is provided between the insulation shrink tube and the assembly of the condenser units U to maximize the protective effect and the insulation effect.

As shown in FIGS. 1 and 2, the supercondenser S further includes a substrate 41 contacted to the plate of the condenser unit U disposed on each of both ends, a supporting plate 42 contacted to the substrate 41, and a fixing plate 43 contacted to the supporting plate 42.

The substrate 41 provides a circuit configuration of the control module 50, and the supporting plate 42 and the fixing plate 43 provide prevention of separation and increase in the bonding force of the assembly of the condenser units U.

In addition, for providing the substrate 41, the supporting plate 42, and the fixing plate 43, various coupling methods using a great number and types of fixing members can be used.

Figure 9:
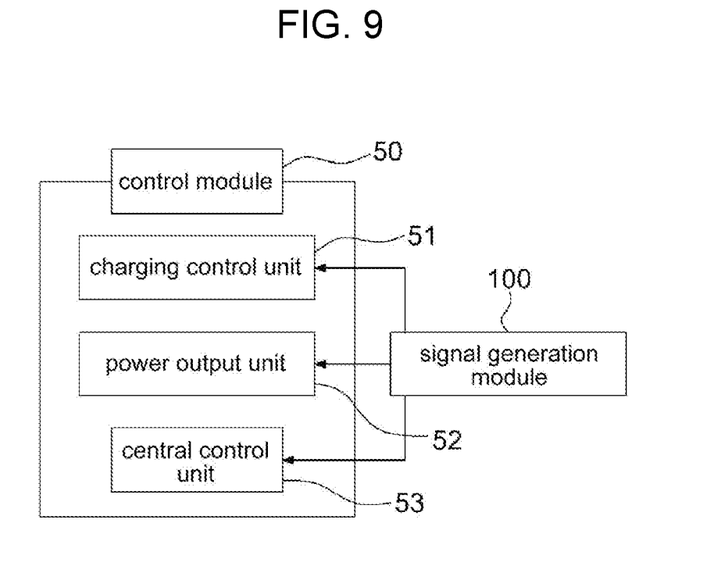
FIG. 9 is a block diagram showing a functional configuration of a control module of the present invention.

FIG. 9 is a block diagram showing a functional configuration of the control module 50.

As shown in FIG. 9, the supercondenser S may include the control module 50, and the control module 50 has a charging control unit 51, a power output unit 52, and a central control unit 53.

For each part, first, the charging control unit for controlling charging of the unit condenser C determines whether external power is applied to the supercondenser S configured of the unit condensers C and performs charging operation control.

Next, the power output unit 52 for outputting electricity stored in the unit condenser C determines whether or not to discharge the supercondenser S configured of the unit condensers C and controls power supplying operation to an external device connected to the supercondenser S.

The central control unit 53 for controlling the charging control unit 51 and the power output unit 52 by using control signals has the central processing unit (CPU, MCU, etc.) to entirely control not only the charging control unit 51 and the power output unit 52 but also subordinate characteristics of the control module 50 according to pre-programed process.

Furthermore, in the present invention, the central control unit 53 controls an operation of each configuration (including the charging control unit 51, the power output unit 52) through the control signals. In this control signal, noise may be introduced due to external factors such as influence of high frequency, interference of strong electric field of a power supply, external environments (temperature, humidity, dust, etc.).

The noise introduced into the control signals increases or decreases a voltage level of the control signals to cause unstable operation of each configuration, and may be a cause of malfunction and failure.

Thus, the present invention has a signal generation module 100 generating a clean control signal that excludes possibility of entering noise to primarily detect and remove the noise introduced into the control signals, thereby being possible to stable operation control.

The signal generation module 100 of the present invention detects and removes the noise through several steps, finally, re-detects whether the noise is included or not before outputting the control signal.

Hereinbelow, referring to FIG. 10, the signal generation module 100 according to an embodiment (a seventh embodiment) of the present invention will be described in detail.

(Hereinbelow, for convenience of description, naming device unit is not separated. It is preferable to guess the device through a corresponding circuit including each device or to classify by using the reference numerals.)

Figure 10:
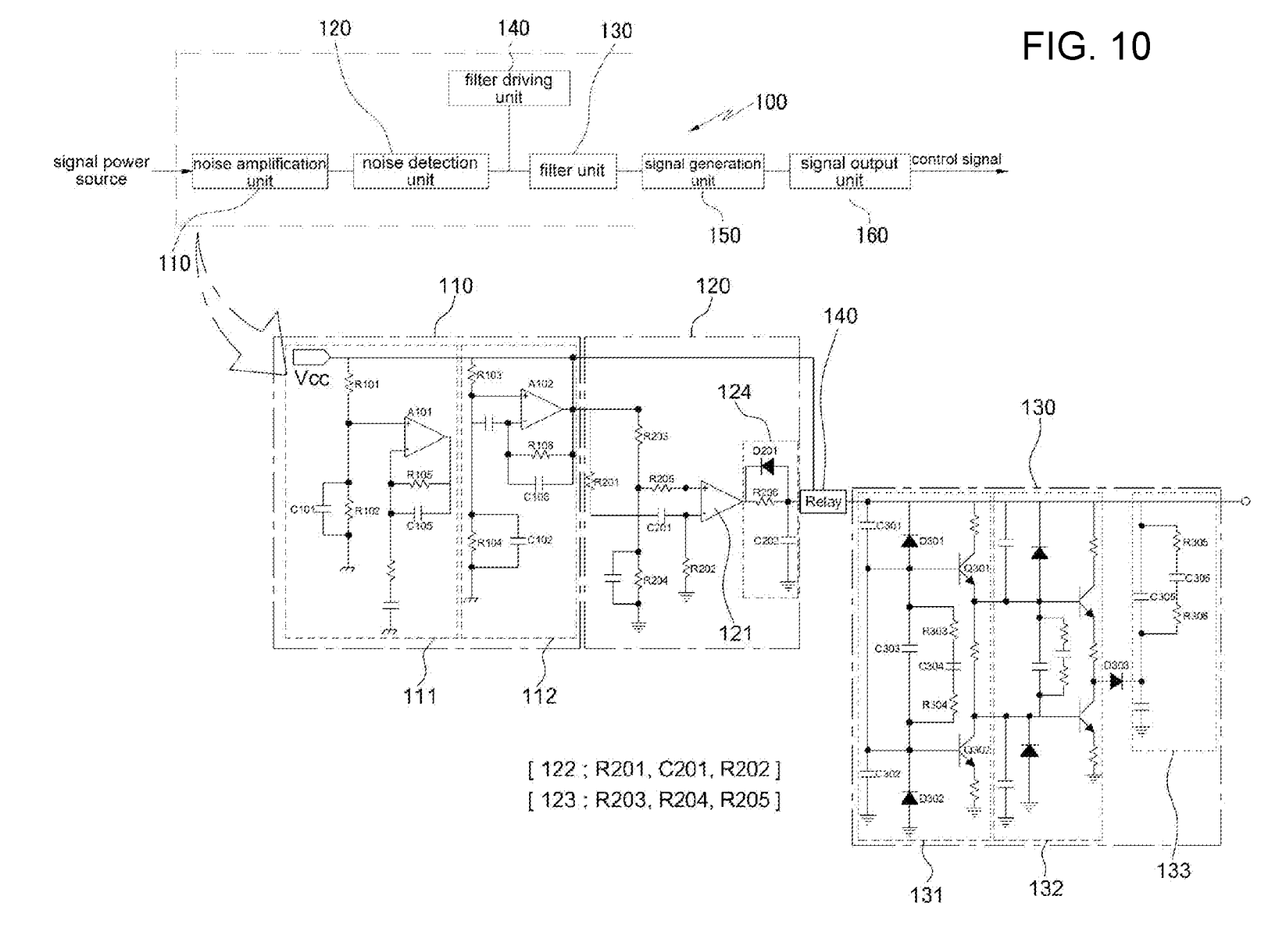
FIG. 10 is a view showing a seventh embodiment of the present invention.

As shown in FIG. 10, the signal generation module 100 includes a noise amplification unit 110 for amplifying DC signal power source, a noise detection unit 120 for detecting noise included in the amplified signal power source, a filter unit 130 for filtering the detected noise, a filter driving unit 140 for driving the filter unit only when noise is detected, a signal generation unit 150 for generating the control signals from the noise-detected signal power source, and a signal output unit 160 for stabilizing and outputting the generated control signal.

The signal generation module 100 amplifies the DC signal power source through the noise amplification unit 110 and also amplifies the noise included therein for easy detection, detects the noise included in the signal power source amplified by the noise detection unit 120, and removes the noise detected from the filter unit 130. However, the signal generation module 100 prevents unnecessary power consumption and operation overload by performing the remove removing process only when the noise is detected through the filter driving unit 140, generates the clean control signal that is removed the noise through the signal generation unit 150, and then determines whether the control signal is clean or not and outputs it through the signal output unit 160.

Referring to FIG. 10, a configuration and an operation process of each part of the signal generation module 100, and effects thereof will be described.

The noise amplification unit 110 includes a first amplification circuit 111 for primarily amplifying the signal power source, and a second amplification circuit 112 for secondly amplifying the signal power source.

The first amplification circuit 111 and the second amplification circuit 112 have the same structure, and each have amplifiers A101 and A102, divided resistors R101, R102, R103, and R104 and capacitors C101 and C102 connected to plus terminals (+) of the amplifiers A101 and A102, and feedback resistors R105 and R106, and the capacitors C105 and C106 connected in parallel between output terminals and minus terminals (−) of the amplifier A101 and A102.

Operations and effects of the first amplification circuit 111 and the second amplification circuit 112 will be described with an example of the first amplification circuit 111, the amplifier A101 operates as a non-inverting amplifier by the divided resistors R101 and R102, the feedback resistor R106, and ground resistor, and amplifies the noise according to amplify voltage level of the signal power source to easily detect noise. Herein, a feedback capacitor C105 prevents oscillation of the amplifier A101.

The second amplification circuit 112 has the same process to amplify the signal power source.

In addition, in the noise amplification unit 110, a output terminal of the amplifier of the first amplification circuit 111 and a minus terminal (−) of the amplifier of the second amplification circuit 112 are connected to each other, whereby the signal power source is primarily amplified in the first amplification circuit 111, and output signal power source is transmitted to the second amplification circuit 112 and is secondary amplified, thus the signal power source is significantly amplified in double so as to easily detect the noise.

Noise detection unit 120 includes a comparator 121, an applying circuit 122 connected to minus terminal (−) of the comparator 121, a reference circuit 123 connected to plus terminal (+) of the comparator 121.

More particularly, the applying circuit 122 includes a DC component removing resistor R201 and the capacitor C201 that are arranged in series, and a noise checking resistor R202.

The reference circuit 123 includes bias resistors R203, R204, and R205 that is arranged in parallel and supplying reference voltage for determination of noise.

The noise detection unit 120 having above mentioned configurations and characteristics will be described. The applying circuit 122 removes DC components and leaves only noise components from the signal power source amplified from the noise amplification unit 110 through the resistor R201 and the capacitor C201. The noise components are then applied to the noise checking resistor R202.

After, the reference circuit generates the reference voltage by bias resistors R203, R204, and R205. The comparator 121 compares the reference voltage and noise voltage applied to the resistor R202 to detect whether the noise is generated or not, and when the noise is detected, a driving signal is transmitted to the filter driving unit 140 so as to drive the filter unit 130, thereby the noise included in the signal power source is removed, and when the noise is not detected, a non-driving signal is transmitted or any signal is not transmitted to the filter driving unit 140 so as to not drive the filter unit 130. Alternately, the signal power source is directly transmitted to the signal generation unit (choice of embodiments of transmitting the non-driving signal or not transmitting any signal may vary depending on specification of the filter driving unit 140.).

(The specific circuit configuration of the filter driving unit 140 is well known in the art, and although not described in detail, one of ordinary skill in the art to which this invention belongs would be able to determine a configuration.)

As shown in FIG. 10, the noise detection unit 120 is preferably further includes a delay circuit 124 for delaying the signal transmitted to the relay.

The delay circuit 124 includes a reverse diode D201 and resister R206 arranged in parallel, and a capacitor C202 connected thereto in parallel.

Through having this delay circuit 124, lifetime of the filter driving unit 140 is extended. In general, since the noise is not generated continuously or periodically, but is intermittently generated, the filter driving unit 140 repeats driving and de-driving and reduces its lifetime. Preferably, through having the delay circuit 124, the filter driving unit 140 is continuously driven until a predetermined time elapses after operation of the filter driving unit 140 to extend the lifetime thereof.

Next, the filter unit 130 includes first to third filtering circuits 131, 132, and 133 in which output terminals and input terminals of each of filtering circuits are connected together in sequence.

The first filtering circuit 131 has NPN type first and second transistors Q301 and Q302 in which an emitter or one transistor and a collector of a remaining transistor are connected together, switching diodes D301 and D302 and capacitors C301 and C302 that are arranged in parallel are connected to bases of the first and second transistors Q301 and Q302, respectively, and two capacitors C303 and C304 arranged in parallel and two resistors R303 and R304 connected with a two capacitors in series are connected between the base of the first transistor Q301 and the base of the second transistor Q302.

The second filtering circuit 132 has same structure as the first filtering circuit 131.

In addition, a third filtering circuit 133 has two capacitors C305 and C306 arranged in parallel, and the two resistors R305 and R306 connected with a capacitor C306 in series, and a backflow prevention diode D303 is provided between the second filtering circuit 132 and the third filtering circuit 133.

Through the filter unit 130 having above mentioned configurations and characteristics, the noise may be removed in three stages, so that noise removing effect is excellent as compared with the conventional noise filter, after the noise is removed, since the signal power source having a constant waveform close to DC may be output, an additional rectification or DC process is not required.

The signal generation unit 150 includes multiple diodes D501 and D502 providing a voltage reduction for control signal generation, a filtering inductor L501 connected thereto in series, and filtering capacitors C501, C502, C503, and C504 connected to the diodes D501 and D502 and the inductor L501 in parallel.

Although two diodes D501 and D502 for voltage reduction are shown in the drawing, a plurality of diodes may be provided, and two or more diodes may be provided according to required degree of the voltage reduction.

Operations and characteristics of the signal generation unit 150 will be described, the signal power source removed the noise is passed by the diodes for voltage reduction D501 and D502 to be converted into a voltage level suitable for the control signal, noise introduced or generated in conversion process are removed by the filtering inductor 501 and the filtering capacitors C501, C502, C503, and C504, thus clean control signal is generated and transmitted to the signal output unit 160.

The signal output unit 160 includes an outputting control device 161 that controls outputting of the control signal, a stabilization circuit 162 that is connected to the outputting control device 161 and removes the noise included in the control signal, a detecting circuit 163 that is connected to the outputting control device 161 and detects state of the control signal to feedback to the outputting control device 161, and a power supplying circuit 164 for supplying power to the outputting control device 161.

In operation and characteristics of each circuit, the stabilization circuit 162 includes a resistor R601 and a diode D601 connected to each other in series, and a capacitor C601 connected thereto in parallel.

The stabilization circuit 162 stores the transmitted control signal in the capacitor C601 through the resistor R601 and the diode D601 to provide a buffer for signal input, thereby suppressing disconnection of the control signal, and preventing the outputting control device 161 from being overloaded.

The detecting circuit 163 includes voltage converting resistors R602 and R603, and filtering capacitors C602 and C603.

The detecting circuit 163 converts current of the control signal to voltage through the resistor R602, applies to the resistor R603, filters through the capacitors C602 and C603 and transmits to the outputting control device 161. Then the outputting control device 161 confirms whether the noise is included in the control signal to be finally output through the detecting circuit 163, and outputs the control signal or commands re-filtering of the control signal.

The power supplying circuit 164 includes voltage converting resistors R604 and R605, charge capacitors C604, C605, and C606 connected in parallel thereto, and a discharge prevention diode D604 connected in series thereto.

Preferably, the outputting control device 161 is always driven as a device for finally checking the output state of the control signal and outputting the control signal, and it is preferable to provide an additional power supply means for an emergency situation as well as a power supply for the entire product. Thus, the power supplying circuit 164 suitably processes the signal power source, so that power for driving the outputting control device 161 is supplied separately.

The power supplying circuit 164: stores the signal power source removed the noise in the capacitors C604, C605, and C606 through the voltage converting resistors R604 and R605 when an emergency situation occurs, thus power can be supplied to the outputting control device 161; and prevents the power stored in the capacitors C604, C605, and C606 from discharging through the diode D604, thus power can be supplied to the outputting control device 161 in an emergency situation.

In the above description, a description of additional devices constituting each circuit is omitted, and the device may be changed in design according to an embodiment by one of ordinary skill in the art to which this invention belongs.

The present invention described above with reference to accompanying drawings may variously modify and change by one of ordinary skill in the art to which this invention belongs, and the modifications and changes should be interpreted as included within the scope of the present invention.

| [Description of Reference Numerals] | |
|---|---|
| S: supercondenser | |
| C: unit condenser | U: condenser unit |
| L: connector | |
| 1: parallel connection means | 10: plate |
| 11: terminal coupling part | |
| 2: serial connection means | |
| 22: connection piece | 23: connection hole |
| 50: control module | |
| 100: signal generation module | |

The invention claimed is:

1. A supercondenser comprising:
a plurality of unit condensers;
a connector having a parallel connection means and a serial connection means, wherein the connector includes: a plate, two or more terminal coupling parts formed in the plate and connecting two or more unit condensers in parallel to form parallel-connected unit condensers, and two or more connection pieces vertically protruding from the plate, the two or more connection pieces each being configured to be connected with a neighboring connection piece formed in a neighboring plate to connect two neighboring parallel-connected unit condensers in series;
a voltage balancing module passing through a connection hole formed in the plate and evenly controlling a voltage difference between the two neighboring parallel-connected unit condensers; and
a fixing shaft inserted through a shaft hole formed at a center of the plate and supporting the plate and the plurality of condensers as connected in parallel and in series.

2. The supercondenser of claim 1, further comprising:
a protective insulation shrink tube surrounding the plurality of condensers and a buffer material provided between the protective insulation shrink and the plurality of condensers.

3. The supercondenser of claim 1, further comprising:
a substrate contacted to each end of the supercondenser and provided with a circuit configuration of a control module;
a supporting plate contacted to the substrate; and
a fixing plate contacted to the supporting plate.

4. The supercondenser of claim 1, further comprising:
a control module including a charging control unit for controlling charging of the plurality of unit condensers by an external power source, a power output unit for outputting electricity stored in the plurality of unit condensers, and a central control unit for controlling the charging control unit and the power output unit.

5. The supercondenser of claim 4, further comprising:
a signal generation module including a noise amplification unit for amplifying a DC signal power source, a noise detection unit for detecting noise included in the amplified DC signal power source, a filter unit for filtering the detected noise, a filter driving unit for driving the filter unit only when noise is detected, a signal generation unit for generating the control signals from the noise-removed signal power source, and a signal output unit for outputting the generated signal power source after determining whether the generated control signal is clean.

6. The supercondenser of claim 5, wherein the noise amplification unit includes a first amplification circuit for primarily amplifying the signal power source, and a second amplification circuit for secondly amplifying the signal power source, wherein the first amplification circuit and the second amplification circuit have respective amplifiers (A101 and A102), divided resistors (R101, R102, R103, and R104) and capacitors (C101 and C102) connected to plus terminals (+) of the amplifiers (A101 and A102), and feedback resistors (R105 and R106) and capacitors (C105 and C106) connected in parallel between output terminals and minus terminals (−) of the amplifiers (A101 and A102), and the output terminal of the amplifier of the first amplification circuit and the plus terminal (+) of the amplifier of the second amplification circuit are connected with each other.

7. The supercondenser of claim 6, wherein the noise detection unit includes: a comparator, an applying circuit connected to a minus terminal (−) of the comparator, and a reference circuit connected to a plus terminal (+) of the comparator,
wherein the applying circuit has
a DC component removing resistor (R201) and a capacitor (C201) that are arranged in series,
a noise checking resistor (R202), and
the reference circuit has bias resistors (R203, R204, and R205) arranged in parallel and supplying a reference voltage for determination of noise.

8. The supercondenser of claim 7, wherein the filter unit has first to third filtering circuits in which output terminals and input terminals of the filtering circuits are connected together in sequence,
wherein the first filtering circuit has
NPN type first and second transistors (Q301 and Q302) in which an emitter of one transistor and a collector of a remaining transistor are connected together,
switching diodes (D301 and D302) and capacitors (C301 and C302) that are arranged in parallel are connected to bases of the first and second transistors (Q301 and Q302), respectively, and
two capacitors (C303 and C304) arranged in parallel and two resistors (R303 and R304) connected with a capacitor (C304) in series are connected between the base of the first transistor (Q301) and the base of the second transistor (Q302).

9. The supercondenser of claim 8, wherein the second filtering circuit has a same structure as the first filtering circuit,
the third filtering circuit has two capacitors (C305 and C306) arranged in parallel, and two resistors (R305 and R306) connected with a capacitor (C306) in series, and
a backflow prevention diode (D303) is provided between the second filtering circuit (132) and the third filtering circuit (133).

* * * * *